United States Patent [19]

Shiga

[11] Patent Number: 5,097,315

[45] Date of Patent: Mar. 17, 1992

[54] INTEGRATED CAPACITOR DISPOSED OVER DAMAGED CRYSTAL AREA

[75] Inventor: Nobuo Shiga, Yokohama, Japan

[73] Assignee: Sumitomo Electric Industries, Ltd., Osaka, Japan

[21] Appl. No.: 588,943

[22] Filed: Sep. 27, 1990

[30] Foreign Application Priority Data

Oct. 5, 1989 [JP] Japan .................................. 1-260879
Oct. 6, 1989 [JP] Japan .................................. 1-261667

[51] Int. Cl.⁵ ..................... H01L 27/02; H01L 29/44; H01P 1/00
[52] U.S. Cl. ......................................... 357/51; 357/68; 357/30; 333/246; 333/247
[58] Field of Search .................. 357/68, 51, 30; 333/246, 247

[56] References Cited

U.S. PATENT DOCUMENTS 3,416,042  12/1968  Thomas et al. ................... 333/247
4,577,213   3/1986  Bauhahn .............................. 357/68
4,783,697  11/1988  Benenati et al. ................... 357/68

Primary Examiner—Jerome Jackson, Jr.
Attorney, Agent, or Firm—Stevens, Davis, Miller & Mosher

[57] ABSTRACT

According to this invention, a circuit element is formed on an upper surface of a semiconductor substrate having a predetermined region where a crystal structure is destroyed, and a conductive pattern is formed on a back surface of the semiconductor substrate located under the predetermined region. Therefore, almost no change in charge occurs in the circuit element and the conductive pattern formed to sandwich the predetermined region where the crystal structure is destroyed. Even if a chip carrier type light-receiving element is used to reduce a ground-capacitance generated in the light-receiving element, the ground-capacitance cannot be sufficiently reduced. For this reason, according to this invention, the first conductive pattern set at a reference potential and a second conductive pattern which is electrically isolated from the first conductive pattern and is applied with a reception signal voltage are formed on a back surface of a circuit board, and a circuit element is mounted on an upper surface of the circuit board located above the second conductive pattern. Therefore, a change in voltage occurring in the circuit element is almost equal to a change in voltage in the second conductive pattern formed on the back surface of the circuit board, resulting in almost no ground-capacitance is generated.

12 Claims, 6 Drawing Sheets

INTEGRATED CAPACITOR DISPOSED OVER DAMAGED CRYSTAL AREA

BACKGROUND OF THE INVENTION

1. Field of the Invention

The present invention relates to a semiconductor device used in a light-receiving circuit or the like in an optical data link, an optical CATV system, or the like.

2. Description of the Related Art

Conventionally, as a light-receiving circuit of this type, a circuit shown in FIG. 1 is known. A light signal is received by a light-receiving element 1, and is converted into a voltage signal by a resistor $R_L$. The received signal converted into the voltage signal is input to a capacitor $C_C$ to remove its DC component. The output from the capacitor $C_C$ is amplified and demodulated by an amplifier 2. The resistor $R_L$, the capacitor $C_C$, and the amplifier 2 are formed on a signal integrated circuit (IC) chip 3. In general, the resistor $R_L$ has a resistance of about several hundreds of $\Omega$ to 10 k$\Omega$, and the DC cutoff capacitor $C_C$ has a capacitance of several pF to several hundreds of pF. A junction capacitance $C_{PD}$ of about 0.5 pF is formed in a p-n junction portion of the light-receiving element 1, a stray capacitance $C_{CG}$ for a ground potential is formed in the capacitor $C_C$, and an input capacitance $C_{IN}$ is formed in an input section of the amplifier 2. High-and low-cutoff frequencies $F_H$ and $F_L$ are respectively given by:

$$F_H = 1/[2\pi(R_L//R_{IN})\cdot(C_{PD}+C_{IN}+C_{CG})] \quad (1)$$

$$F_L = 1/[2\pi(R_L//R_{IN})\cdot C_C] \quad (2)$$

where $R_{IN}$ is the input resistance of the amplifier 2, and the symbol "//" represents a parallel-synthesized resistance of resistances before and after this symbol.

However, in the arrangement of the conventional device, as can be understood from equation (1), if the resistance of the resistor $R_L$ is increased to increase reception sensitivity of the circuit, an S/N ratio as a ratio of signal to noise is increased, and the sensitivity can be improved. However, the high-cutoff frequency $F_H$ is undesirably decreased. When the resistance of the resistor $R_L$ is constant, the smaller a value of $(C_{PD}+C_{IN}+C_{CG})$ becomes, the higher the high-cutoff frequency $F_H$ becomes.

As can be understood from equation (2), in order to decrease the low-cutoff frequency $F_L$, when the resistance of the resistor $R_L$ is constant, the capacitance of the DC cut capacitor $C_C$ must be increased. For this reason, in a chip pattern inside the IC chip 2 shown in FIG. 2, a chip pattern 4 of the capacitor $C_C$ occupies a large area in the entire pattern area. Therefore, the stray capacitance $C_{CG}$ formed between the chip pattern 4 and a ground pattern (not shown) formed on the entire back surface of the IC chip 3 is increased, and the high-cutoff frequency $F_H$ is undesirably decreased. When the capacitance of the capacitor $C_C$ is decreased to decrease the stray capacitance $C_{CG}$, the low-cutoff frequency $F_L$ is increased, and jitter components are increased.

As another conventional light-receiving circuit, a bootstrap type circuit shown in FIG. 3 is also known. A light signal is received by a light-receiving element 5 which is boosted to a power supply potential by a resistor $R_Q$, and the received signal is then converted into a voltage signal by a resistor $R_L$. The received signal converted into the voltage signal is input to a capacitor $C_C$ to remove a DC component therefrom. The output from the capacitor $C_C$ is supplied to a buffer amplifier 6 having a gain of 1. The output from the buffer amplifier 6 is fed back to the light-receiving element 5 via a capacitor $C_Q$. At the same time, the output from the buffer amplifier 6 is supplied to an amplifier 7, and then is amplified and demodulated by the amplifier 7. The resistor $R_L$ and $R_Q$, the capacitors $C_C$ and $C_Q$, and the amplifiers 6 and 7 are formed on a single integrated circuit (IC) chip 8, and the light-receiving element 5 is formed into a pattern of a carrier chip 9.

In general, the resistor $R_L$ has a resistance of about several hundreds of $\Omega$ to 10 k$\Omega$, and the DC cutoff capacitor $C_C$ has a capacitance of several pF to several hundreds of pF. A junction capacitance $C_{PD}$ of about 0.5 pF is formed in a p-n junction of the light-receiving element 5. When the light-receiving element 5 is mounted on a circuit board, ground-capacitances $C_1$ and $C_2$ are formed in a cathode-ground path and an anode-ground path of the light-receiving element 5.

FIG. 4 shows frequency characteristics of reception signals having values of the ground-capacitances $C_1$ and $C_2$ as parameters. A frequency [Hz] is plotted along the abscissa, and an attenuation amount [dB] of a reception signal is plotted along the ordinate. Note that the characteristics are obtained as a result of simulations. Curves 10, 11, 12, and 13 respectively represent frequency characteristics when ground-capacitances $C_1$ (= $C_2$) are 0 pF, 0.05 pF, 0.1 pF, and 0.2 pF, respectively. As can be understood from the curve 10, when the ground-capacitance is 0 pF, a signal can be received over a very wide frequency range. However, even if a very small ground-capacitance of about 50 fF or 100 fF indicated by the curve 11 or 12 is generated in the light-receiving element 5, the reception frequency bandwidth of the light-receiving circuit is considerably narrowed.

For this reason, in a high-speed, wide-range light-receiving circuit, no can type package is employed for the light-receiving element 5 but a chip carrier type package shown in FIG. 5 is employed to reduce the ground-capacitances $C_1$ and $C_2$. In the light-receiving element of this type, terminals 14 and 15 formed by metallizing a metal are formed on a ceramic substrate 16, and a light-receiving section 17 is formed on the terminal 14 located at the central portion of the substrate. The terminal 14 corresponds to the cathode, and the terminal 15 corresponds to the anode. A surface 16a of the ceramic substrate 16 is a mounting surface to a circuit board, and the dimensions of this package are normally about 2 mm×2 mm×4 mm. The ground-capacitance in the light-receiving element of the chip carrier type is smaller by 0.5 pF or more than that of a light-receiving element of a can type package.

However, even in the chip carrier type light-receiving element, the ground-capacitances $C_1$ and $C_2$ cannot be sufficiently reduced, as will be described in detail below.

FIG. 6 partially shows a pattern of a light-receiving circuit board 18 constituted by using the carrier chip 9 shown in FIG. 5. A preamplifier, a main amplifier, and the like (not shown) are mounted on this circuit board 18, and a ground pattern which is set at a reference potential of the mounted circuit is formed on the back surface of the circuit board 18. The surface 16a of the carrier chip 9 is in contact with the upper surface of the circuit board 18, and the terminals 14 and 15 are electrically connected to conductive patterns 19 and 20 by bonding. The conductive patterns 19 and 20 are connected to a preamplifier circuit, and are formed to have slightly larger areas than those of the terminals 14 and 15. When the carrier chip 9 is to be bonded to the circuit board 18, the excess areas are required as a margin for alignment.

More specifically, each of the terminals 14 and 15 on the surface 16a has a size of about 0.5 mm×2 mm, and the conductive patterns 19 and 20 are formed to be larger by 100 μm than the contours of the terminals 14 and 15. More specifically, each of the conductive patterns 19 and 20 is formed to have a size of 0.7 mm×2.2 mm, and its area is 1.54 mm². The ground-capacitances $C_1$ and $C_2$ are formed between the conductive patterns 19 and 20 and the ground pattern formed on the back surface of the circuit board 18. When a normally used 635-μm thick ceramic circuit board is used as the circuit board 18, the ground-capacitances $C_1$ and $C_2$ are calculated as follows:

$$C_1 = C_2 = 8.854 \times 10^{-12} \times 9 \times$$
$$(1.54 \times 10^{-6}/6.35 \times 10^{-6})$$
$$= 1.93 \times 10^{-13}$$

Note that "$8.854 \times 10^{-12}$" is the vacuum permittivity, and "9" is the dielectric constant of ceramic. When the light-receiving element of the chip carrier type is used, the ground-capacitances $C_1$ and $C_2$ of about 200 fF are generated. For this reason, the light-receiving element has frequency characteristics, as indicated by the curve 13 in FIG. 4, and the reception bandwidth is narrowed.

SUMMARY OF THE INVENTION

The present invention solves the above problems, and has an object to provide a semiconductor device having high reception sensitivity and a wide reception band. For this purpose, according to the present invention, in order to solve the problem of the first prior art device shown in FIG. 1, a semiconductor device comprises a semiconductor substrate having a predetermined region where a crystal structure is destroyed, a circuit element monolithically formed on an upper surface portion of the semiconductor substrate located on the predetermined region, and a conductive pattern which is formed on a back surface portion of the semiconductor substrate located under the predetermined region, and is electrically isolated from a reference potential of an electric circuit constituted by the circuit element. Therefore, almost no change in charge occurs in the circuit element and the conductive pattern which are formed to sandwich the predetermined region where the crystal structure is destroyed. For this reason, almost no stray capacitance is formed in a capacitor for removing a DC component. As a result, a semiconductor device having high sensitivity and a wide band can be provided.

In order to solve the problem of the second prior art device shown in FIG. 3, according to the present invention, in a semiconductor device, the first conductive pattern set at a reference potential of a receiver circuit and the second conductive pattern electrically isolated from the first conductive pattern and applied with a received signal voltage are formed on a back surface of a circuit board, and a circuit element for receiving the signal voltage is mounted on an upper surface portion of the circuit board located above the second conductive pattern. For this reason, a change in voltage occurring in the circuit element is almost equal to a change in voltage in the second conductive pattern formed on the back surface of the circuit element. Therefore, the ground-capacitance generated in a conventional circuit element can be reduced to substantially zero, and a semiconductor device having high reception sensitivity and a wide reception band can be provided.

The present invention is particularly effective when it is applied to a high-speed, wide-band communication system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 7:
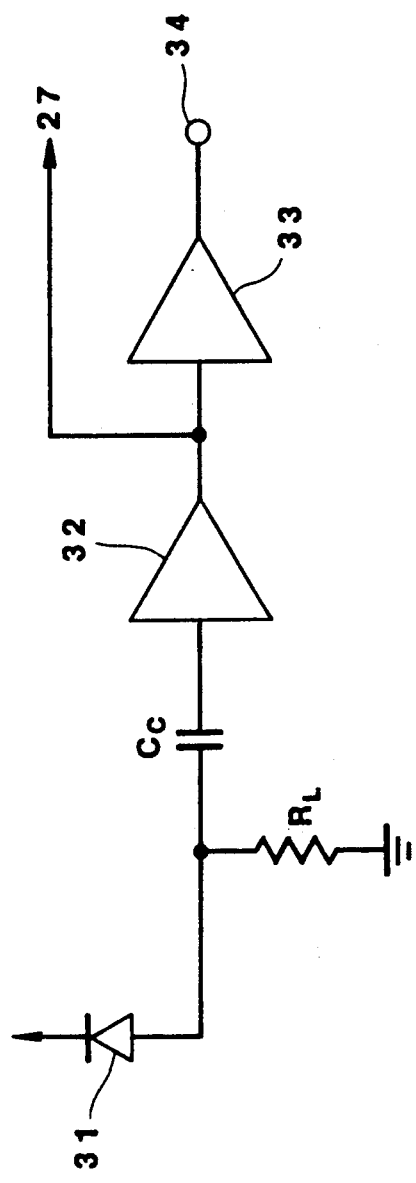
FIG. 7 is a circuit diagram of a light-receiving circuit formed in a semiconductor device according to the first embodiment of the present invention.

FIG. 7 is a circuit diagram showing a light-receiving circuit according to the first embodiment of the present invention. The light-receiving circuit is monolithically formed on a semiconductor substrate (to be described later). According to the first embodiment, the problem of the first prior art shown in FIG. 1 can be solved.

A photodiode 31 is connected in series with a resistor $R_L$. One terminal of a capacitor $C_C$ is connected to a node between the photodiode 31 and the resistor $R_L$, and the other terminal thereof is connected to the input terminal of a buffer amplifier 32 as a positive inverting amplifier having a gain of 1. The buffer amplifier 32 comprises, e.g., a source-follower circuit, and its output is supplied to an amplifier 33. The output terminal of the amplifier 33 is connected to an external terminal 34, and the external terminal 34 is connected to a receiver (not shown). The output terminal of the buffer amplifier 32 is also connected to an isolated pattern 27 (to be described later).

Figure 8A:
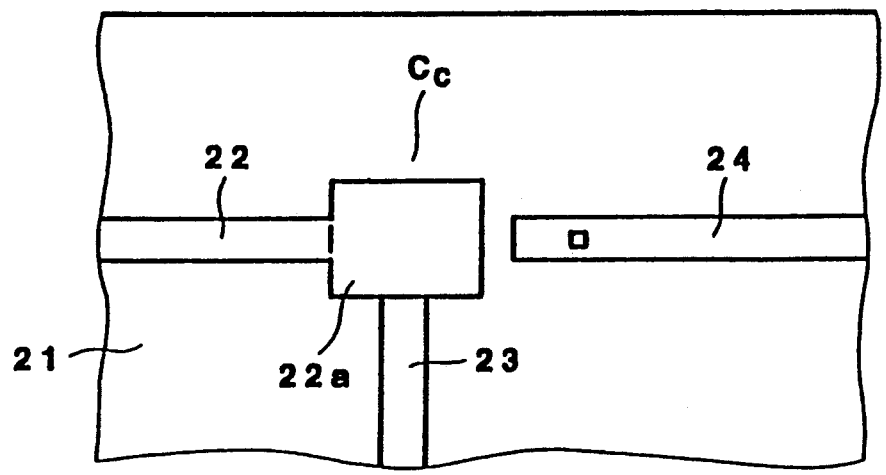
FIG. 8A is a partial plan view of a semiconductor device in which the light-receiving circuit shown in FIG. 7 is formed.
Figure 8B:
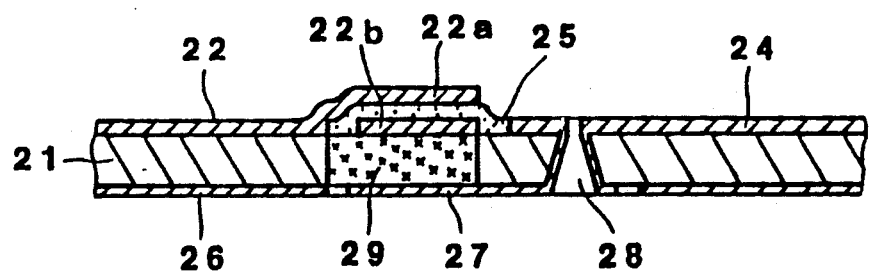
FIG. 8B is a cross-sectional view of the semiconductor device shown in FIG. 8A.
Figure 8C:
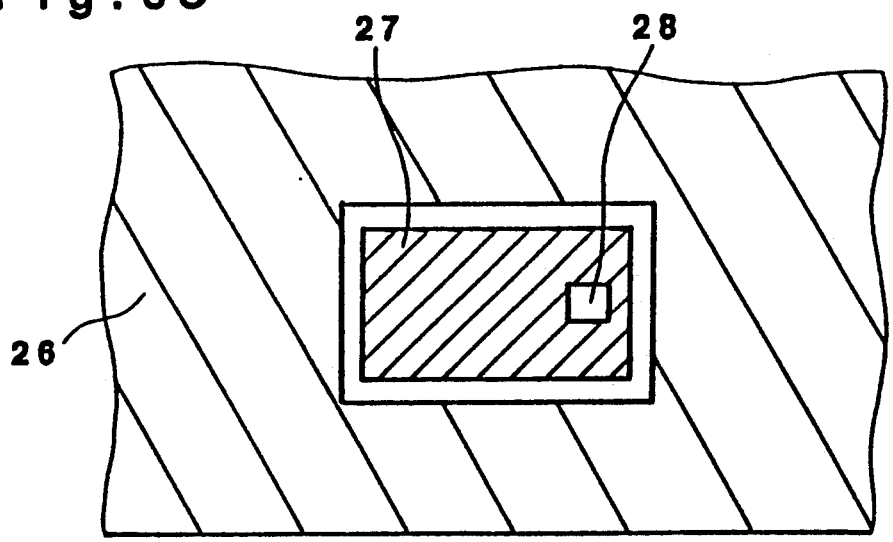
FIG. 8C is a bottom view of the semiconductor device shown in FIG. 8A.

FIGS. 8A to 8C partially show a semiconductor substrate on which the light-receiving circuit shown in FIG. 7 is formed. FIG. 8A is a plan view, FIG. 8B is a cross-sectional view, and FIG. 8C is a bottom view of the substrate.

The light-receiving circuit shown in FIG. 7 is formed on a semiconductor substrate 21, and FIG. 8A illustrates the capacitor $C_C$ as a part of the circuit. One terminal of the capacitor $C_C$ is connected to the resistor $R_L$ via a conductive pattern 22, and the other terminal is connected to the input terminal of the buffer amplifier 32 via a conductive pattern 23. One end of the conductive pattern 24, which end is cut away in FIGS. 8A and 8B, is connected to the output terminal of the buffer amplifier 32. The capacitor $C_C$ is constituted by the first and the second conductive layers 22a and 22b sandwiching an insulating film 25 therebetween. Protons ($H^+$ ions) accelerated by a high electric field are injected in a predetermined region 29 of the semiconductor substrate 21, which region is located under the capacitor $C_C$, thereby destroying its crystal structure.

A wide ground pattern 26 is formed on the back surface of the semiconductor substrate 21 by metallizing gold palladium, silver palladium, or the like, as shown in FIG. 8C. The ground pattern 26 is set at a reference potential of the light-receiving circuit formed on the semiconductor substrate 21. The metallized metal is patterned by an etching technique to form an isolated island pattern 27 which is electrically isolated from the ground pattern 26. The isolated pattern 27 is connected to the conductive pattern 24 through a via hole 28, and is set at the same potential as the output voltage of the buffer amplifier 32.

In this structure, when the photodiode 31 receives a light signal, the light signal is converted into a light output current. The light output current is converted into a voltage signal by the resistor $R_L$, and a DC component is removed from the voltage signal by the capacitor $C_C$. The reception signal from which the DC component is removed is amplified and demodulated by the amplifier 33 via the buffer amplifier 32, and is then supplied to a receiver through the external terminal 34.

The received signal output from the buffer amplifier 32 is supplied to the isolated pattern 27 via the conductive pattern 24. Therefore, a change in AC voltage in the isolated pattern 27 is equal to a change in AC output voltage of the buffer amplifier 32. A change in AC voltage in the second conductive layer 23a constituting one electrode of the capacitor $C_C$ is equal to a change in AC input voltage of the buffer amplifier 32. For this reason, a change in AC voltage in the second conductive layer 23a is almost equal to the change in AC voltage in the isolated pattern 27. More specifically, amplitudes of voltages in the second conductive layer 23a and the isolated pattern 27 located on its back surface are almost equal to each other, and their phases are also equal to each other. Almost no change in charge occurs in the second conductive layer 23a and the isolated pattern 27 which are formed to sandwich the region 29 where the crystal structure is destroyed. That is, almost no charges are produced in the region 29 since the crystal structure therein is destroyed.

A stray capacitance $C_{CG}$ of the capacitor $C_C$ to a ground potential (isolated pattern 27) is a parasitic one formed between the second conductive layer 23a and the isolated pattern 27, and can be defined by a ratio of a change $\Delta Q$ in charge accumulated across the two electrodes to a change $\Delta V$ in voltage across the two electrodes. Therefore, since neither change $\Delta V$ in voltage nor the change $\Delta Q$ in charge between the conductive layer 23a and the isolated pattern 27 occur, as described above, almost no stray capacitance $C_{CG}$ is generated.

For this reason, the high-cutoff frequency $F_H$ of the received signal given by equation (1) described above can be increased since the stray capacitance $C_{CG}$ is almost zero. The capacitance of the DC cutoff capacitor $C_C$ can be increased regardless of the stray capacitance $C_{CG}$, and the low-cutoff frequency $F_L$ given by equation (2) can be decreased. Therefore, the band of the circuit can be widened. Since the capacitance $C_{CG}$ in equation (1) is decreased and the capacitance $C_C$ in equation (2) is increased, the resistance of the resistor $R_L$ can be increased, thus improving sensitivity of the circuit.

The low-cutoff frequency $F_L$ in the light-receiving circuit of this type is normally set to be 1/100 to 1/1,000 or less than the high-cutoff frequency $F_H$. Therefore, when a light-receiving circuit having bandwidth of 500 MHz is to be prepared, the low-cutoff frequency $F_L$ must be 5 MHz or less. When the minimum reception sensitivity of the circuit is set to be $-30$ dBm, the resistor $R_L$ connected in series with the photodiode 31 requires a resistance of at least 1 k$\Omega$. In this case, the capacitance of the DC cutoff capacitor $C_C$ is calculated as follows by substituting constants in equation (2) representing the low-cutoff frequency $F_L$. Since the resistance of the resistor $R_L$ is sufficiently higher than an input resistance $R_{IN}$ of the amplifier 32, a parallel-synthesized resistance $R_L // R_{IN}$ of the resistance $R_L$ and $R_{IN}$ is almost equal to the resistance of the resistor $R_L$.

$$5 \times 10^6 = 1/(2\pi \cdot 1 \times 10^3 \cdot C_C)$$

$$C_C = 31.8 \text{ pF}$$

A capacitor which can be monolithically formed on an IC has a capacitance of about 0.05 to 0.1 fF/$\mu$m$^2$. Even if a capacitor of 0.1 fF/$\mu$m$^2$ can be prepared, the capacitor $C_C$ must have an area of 318,000 $\mu$m$^2$.

Figure 1:
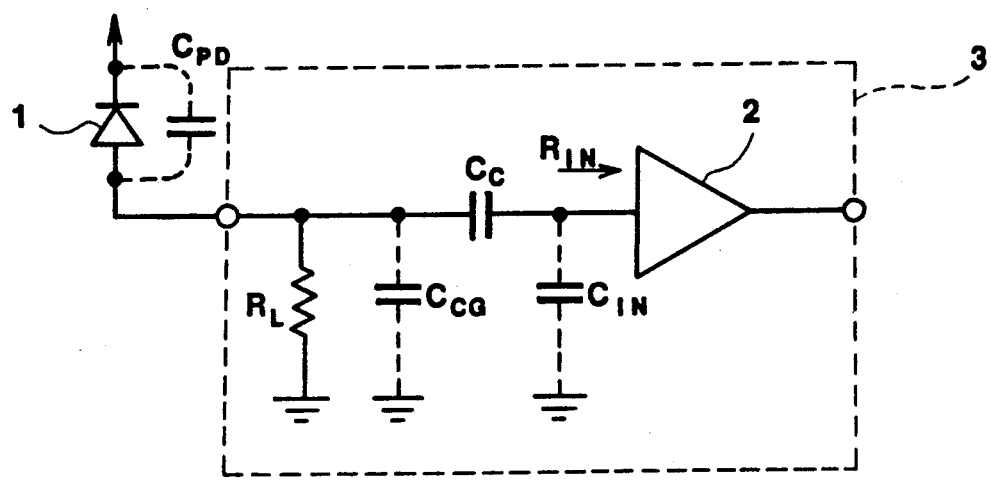
FIG. 1 is a circuit diagram of a light-receiving circuit formed in a first conventional semiconductor device.
Figure 2:
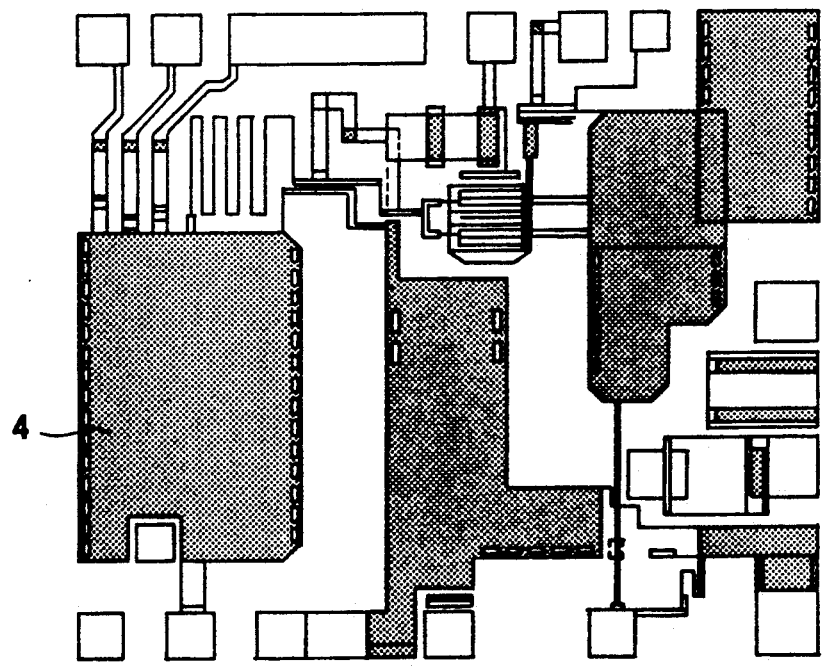
FIG. 2 is a diagram showing a chip pattern of the IC chip shown in FIG. 1.

When the capacitor $C_C$ having this area is realized by the convention device structure shown in FIG. 1, the stray capacitance $C_{CG}$ to a ground potential is as follows if an IC is formed of gallium arsenide (GaAs). Assume that a GaAs substrate has a general thickness of 400 $\mu$m, and its dielectric constant $\epsilon$ is 13.

$$C_{CG} = \epsilon_0 \epsilon \cdot 318{,}000 \div 400$$
$$= 92 \, fF$$

In general, since a sum ($C_{PD} + C_{IN}$) of the junction capacitance $C_{PD}$ of the light-receiving element 1 and the input capacitance $C_{IN}$ of the amplifier 2 is 0.4 to 0.6 pF, the stray capacitance $C_{CG}$ occupies about 20% of this sum in the conventional device structure, and is not negligible. Therefore, the denominator of equation (1) is increased by the stray capacitance $C_{CG}$, and the high-cutoff frequency $F_H$ is decreased under the influence of the stray capacitance $C_{CG}$. As a result, the bandwidth of a signal received by the circuit is narrowed.

However, according to this embodiment, changes in voltage of the electrodes constituting the stray capacitance $C_{CG}$ are almost equal to each other, and almost no change in charge accumulated in the electrodes occurs, as described above. Therefore, even if the area of the capacitor $C_C$ is increased as large as 318,000 $\mu m^2$, almost no stray capacitance $C_{CG}$ to the isolated pattern 27 is generated. For this reason, the bandwidth of a signal received by the circuit is widened, and reception sensitivity of the circuit can be increased.

In the description of the first embodiment, the output voltage of the buffer amplifier 32 is applied to the isolated pattern 27, so that changes in voltage in the second conductive layer 23a and the isolated pattern 27 are almost equal to each other. However, this structure need not always be required. More specifically, by destroying the crystal structure of the region 29, a ratio of the $\Delta Q$ in charge to the change $\Delta V$ in voltage becomes almost zero, and the stray capacitance $C_{CG}$ can be sufficiently reduced.

Figure 3:
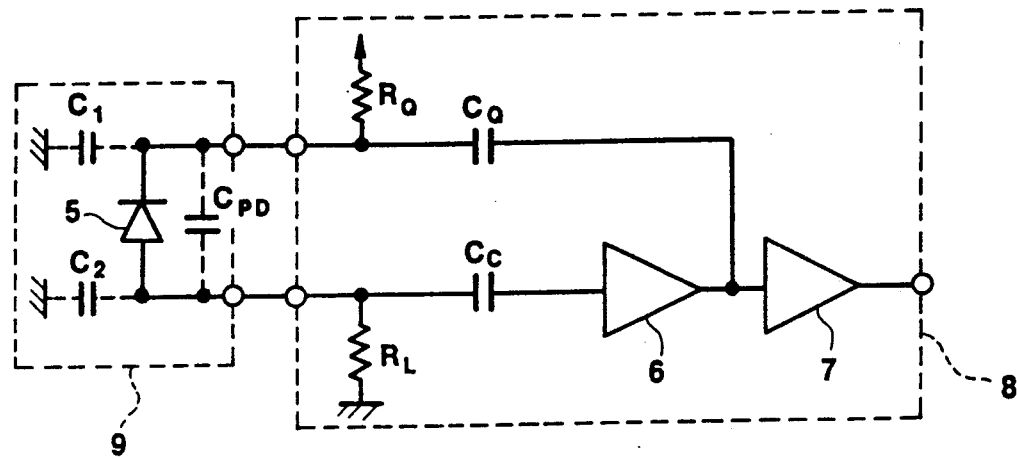
FIG. 3 is a circuit diagram of a light-receiving circuit formed in a second conventional semiconductor device.
Figure 4:
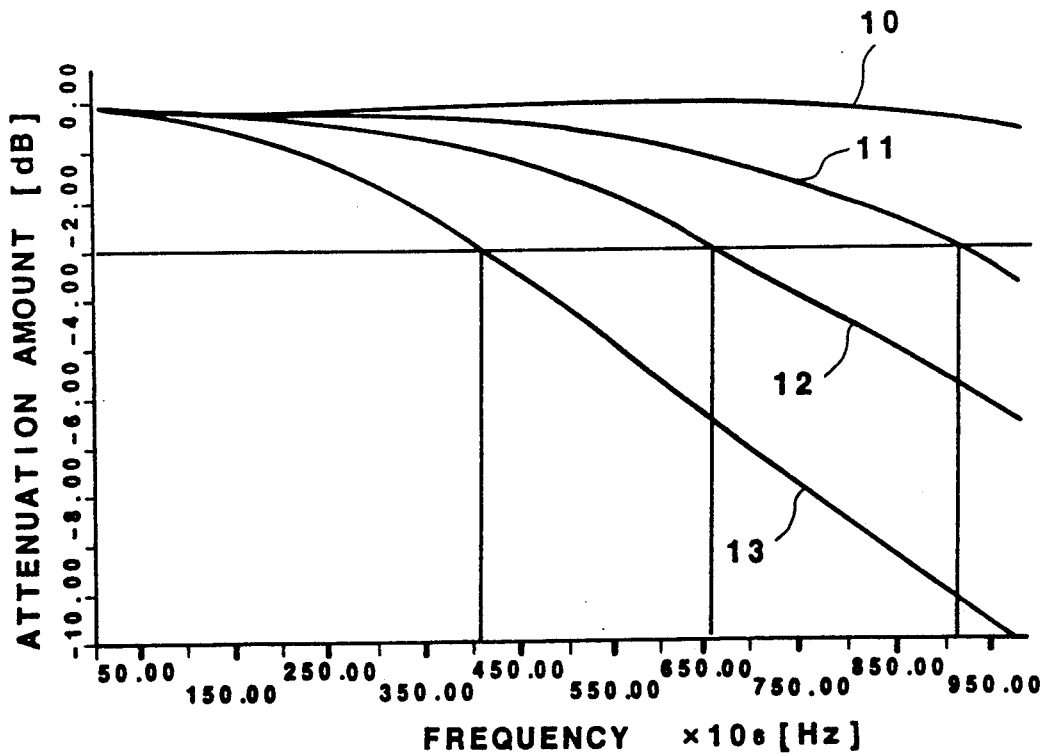
FIG. 4 is a graph showing frequency characteristics of the light-receiving circuit having ground-capacitances generated in a light-receiving element shown in FIG. 3 as parameters.
Figure 9A:
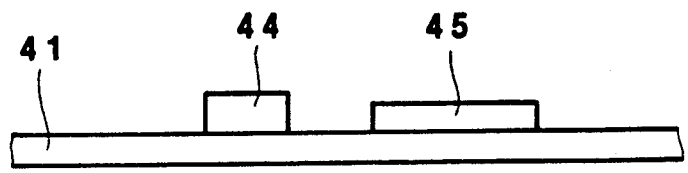
FIG. 9A is a side view of a semiconductor device according to the second embodiment of the present invention.
Figure 9B:
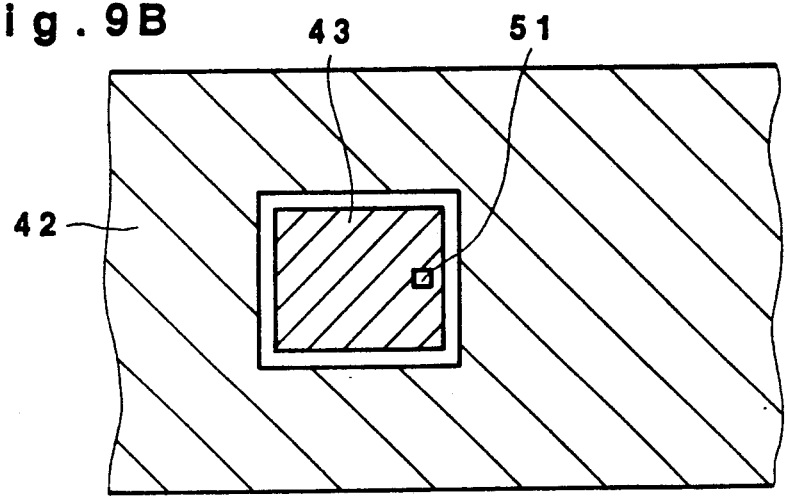
FIG. 9B is a bottom view of the semiconductor device shown in FIG. 9A.

FIGS. 9A and 9B show a structure of a semiconductor device according to the second embodiment of the present invention. FIG. 9A is a side view and FIG. 9B is a bottom view. According to the second embodiment, the problem of the second prior art device shown in FIG. 3 can be solved.

A ceramic circuit board 41 is formed of a material such as alumina ($Al_2O_3$) having an electrical insulating property. A wide ground pattern 42 is formed on the back surface of the circuit board 41 by metallizing gold palladium, silver palladium, or the like. The ground pattern 42 is set at a reference potential common to semiconductor circuit chips of a light-receiving circuit mounted on the circuit board 41. The metallized metal is patterned by a etching technique to form an isolated island pattern 43 which is electrically isolated from the ground pattern 42. A carrier chip 44 on which a photodiode is formed is die-bonded onto the upper surface portion of the circuit board 41 which portion is located above the isolated pattern 43. An IC chip 45 on which a demodulation circuit is formed is die-bonded onto the upper surface portion of the circuit board 41 separated from the carrier chip 44.

Figure 10:
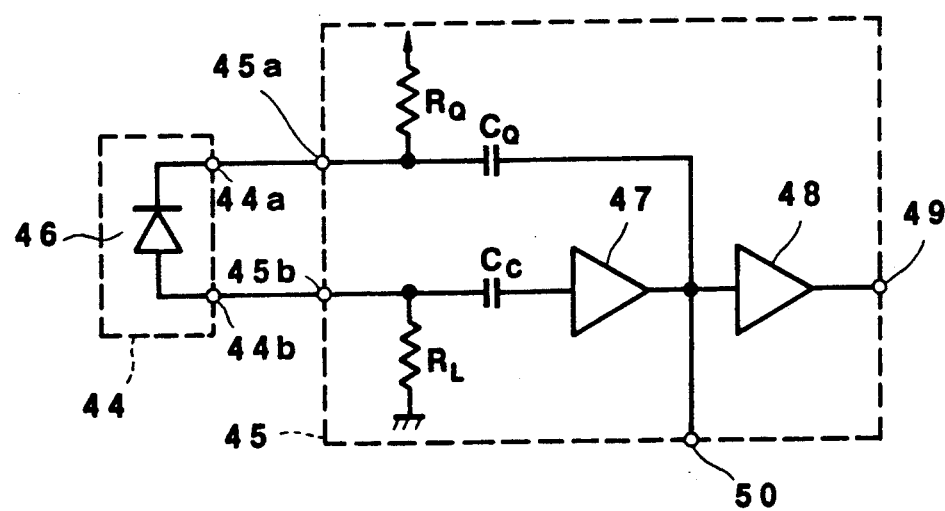
FIG. 10 is a circuit diagram of a light-receiving circuit formed in the semiconductor device shown in FIGS. 9A and 9B.

FIG. 10 is a circuit diagram of light-receiving circuit constituted by the carrier chip 44 and the IC chip 45.

External terminals 45a and 45b of the IC chip 45 are connected to external terminals 44a and 44b of the carrier chip 44 via a conductive pattern (not shown) formed on the upper surface of the circuit board 41. With this conductive pattern, the cathode and anode of a photodiode 46 formed on the carrier chip 44 are connected to one terminal of a corresponding one of resistors $R_Q$ and $R_L$. This terminal of each of the resistors $R_Q$ and $R_L$ is also connected to one terminal of a corresponding one of capacitors $C_Q$ and $C_C$. The other terminal of each of the resistors $R_Q$ and $R_L$ is set at a corresponding one of a power supply potential and a ground potential.

The capacitor $C_C$ is used to remove a DC component included in a received signal. The other terminal of the capacitor $C_C$ is connected to the input terminal of a buffer amplifier 47. Since the other terminal of the capacitor $C_Q$ is connected to the output terminal of this buffer amplifier 47, the output from the buffer amplifier 47 is fed back to the cathode of the photodiode 46. The buffer amplifier 47 is a positive inverting amplifier having a gain of 1, and comprises, e.g., a source-follower circuit. The output terminal of the buffer amplifier 47 is connected to the input terminal of an amplifier 48. The output terminal of the amplifier 48 is connected to an external terminal 49. The output terminal of the buffer amplifier 47 is also connected to an external terminal 50. The external terminal 50 is connected to the isolated pattern 43 via a conductive pattern (not shown) formed on the upper surface of the circuit board 41. This connection is attained through a via hole 51.

With this structure, when a light signal is received by the photodiode 46, the light signal is converted into a light output current. The light output current is converted into a voltage signal by the resistor $R_L$, and a DC component is removed from the voltage signal by the capacitor $C_C$. The received signal from which the DC component is removed is amplified and demodulated by the amplifier 48 via the buffer amplifier 47, and is then supplied to a predetermined receiver via the external terminal 49. The received signal voltage output from the buffer amplifier 47 is also supplied to the isolated pattern 43 via the external terminal 50.

Figure 5:
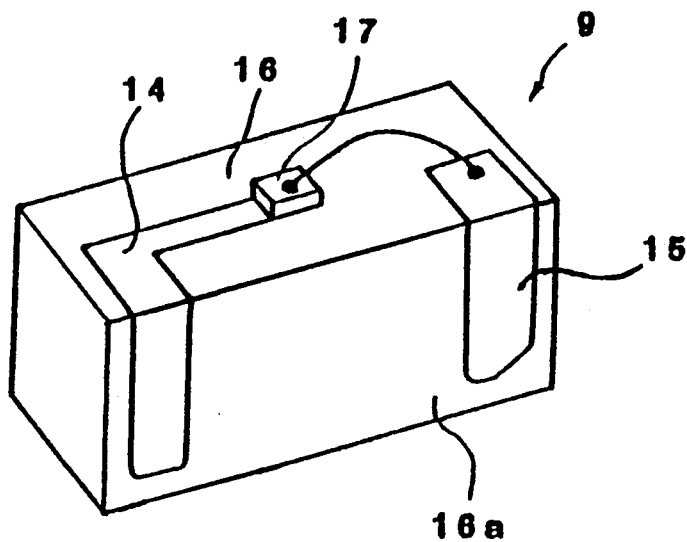
FIG. 5 is a perspective view showing a chip carrier type light-receiving element.
Figure 6:
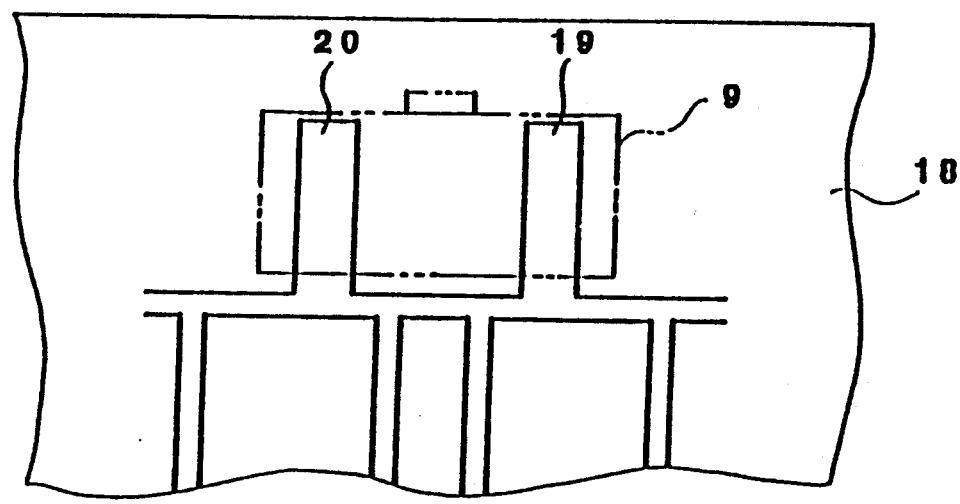
FIG. 6 is a diagram showing a conductive pattern of a circuit board on which the light-receiving element shown in FIG. 5 is mounted.

Therefore, a change in AC voltage at the anode of the photodiode 46 via the capacitor $C_C$ and a change in AC voltage at the cathode of the photodiode 46 via the capacitor $C_Q$ are transmitted to the isolated pattern 43, and are almost equal to a change in AC voltage in the isolated pattern 43. More specifically, amplitudes of AC voltages in the anode and cathode of the photodiode 46 and the isolated pattern 43 are almost equal to each other, and their phases are equal to each other. Capacitances $C_1$ and $C_2$ of the photodiode 46 to a ground potential (isolated pattern 43) are parasitic ones formed between the cathode and anode terminals of the chip carrier 44 (corresponding to terminals 14 and 15 in FIG. 5) and the isolated pattern 43, and are defined by a ratio of a change $\Delta Q$ in charge accumulated across the two electrodes to a change $\Delta V$ in voltage across the two electrodes. Therefore, since changes in AC voltages in respective portions are almost equal to each other, almost no ground-capacitances $C_1$ and $C_2$ are generated.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor device comprising:
   a semiconductor substrate having a predetermined region where a crystal structure is destroyed;
   a circuit element monolithically formed on an upper surface portion of said semiconductor substrate located in said predetermined region;
   a first conductive pattern formed on a back surface portion of said semiconductor substrate located under said predetermined region; and
   a second conductive pattern formed on said semiconductor substrate for providing a reference potential to an electric circuit which includes said circuit element, said first conductive pattern being electrically isolated from said second conductive pattern and electrically connected to said circuit element.

2. A semiconductor device according to claim 1, wherein said circuit element is connected to an input terminal of a positive inverting amplifier having a gain of 1, and said conductive pattern is connected to an output terminal of said positive inverting amplifier.

3. A semiconductor device according to claim 1, wherein said electric circuit constituted by said circuit element comprises a light-receiving circuit.

4. A semiconductor device according to claim 2, wherein said electric circuit constituted by said circuit element comprises a light-receiving circuit.

5. A semiconductor device according to claim 4, wherein said light-receiving circuit comprises a light-receiving element, a resistor connected in series with said light-receiving element, a capacitor, one terminal of which is connected to a node between said light-receiving element and said resistor, said positive inverting amplifier which has gain of 1 and an input terminal of which is connected to the other terminal of said capacitor, and an amplifier, an input terminal of which is connected to an output terminal of said positive inverting amplifier, and a crystal structure under said capacitor is destroyed, and the output terminal of said positive inverting amplifier is connected to said conductive pattern under the destroyed crystal structure.

6. A semiconductor device, comprising:
a circuit board;
a receiving circuit mounted on said circuit board;
a circuit element mounted on said circuit board for receiving a signal transmitted to said receiving circuit;
a first conductive pattern formed on a back surface of said circuit board and set at a reference potential of said receiving circuit; and
a second conductive pattern and formed on a back surface of said circuit board and electrically isolated from said first conductive pattern and applied with a reception signal voltage;
said circuit element being mounted on an upper surface portion of said circuit board located above said second conductive pattern; and wherein the reception signal voltage of said receiving circuit is input to a positive inverting amplifier having a gain of 1, and an output from said positive inverting amplifier is supplied to said second conductive pattern.

7. A semiconductor device according to claim 6, wherein said receiving circuit comprises a light-receiving circuit.

8. A semiconductor device according to claim 7, wherein said light-receiving circuit comprises a chip carrier type light-receiving element on a side surface of which anode and cathode terminals are formed, a resistor connected to said anode terminal, two capacitors, one terminal of each of which is connected to a corresponding one of said anode and cathode terminals, said positive inverting amplifier which has a gain of 1, an input terminal of which is connected to the other terminal of said capacitor connected to said anode terminal, and an output terminal of which is connected to the other terminal of said capacitor connected to said cathode terminal, and an amplifier, an input terminal of which is connected to the output terminal of said positive inverting amplifier, and the output terminal of said positive inverting amplifier is connected to said second conductive pattern formed under a circuit board region where said anode and cathode terminals of said light-receiving element are fixed.

9. A semiconductor device, comprising:
a semiconductor substrate having a predetermined region where a crystal structure is destroyed;
an electric circuit formed on a front surface of said semiconductor substrate and comprising a circuit element monolithically formed on said predetermined region;
a first conductive pattern formed on a back surface of said substrate and electrically connected to said electric circuit to supply a reference potential to said electric circuit; and
a second conductive pattern formed on said predetermined region in said back surface of said substrate and electrically isolated from said first conductive pattern on said back surface,
said second conductive pattern being electrically connected to said circuit element.

10. A semiconductor device according to claim 9, wherein said electric circuit constituted by said circuit element comprises a light-receiving circuit.

11. A semiconductor device, comprising:
a circuit board having a first conductive pattern formed on a back surface thereof and a second conductive pattern formed on said back surface, said second conductive pattern being electrically isolated from said first conductive pattern;
a receiving circuit located on a front surface of said circuit board; and
a circuit element for receiving a signal transmitted to said receiving circuit,
said first conductive pattern being set at a common reference potential to supply said common reference potential to said receiving circuit, and a receiving signal voltage of said receiving circuit being applied to said second conductive pattern.

12. A semiconductor device according to claim 11, wherein said receiving circuit comprises a light-receiving circuit.

* * * * *